(12) United States Patent
Morisse et al.

(10) Patent No.: US 11,142,013 B2
(45) Date of Patent: Oct. 12, 2021

(54) METHOD FOR SMOOTHER TONAL RESPONSE IN FLEXOGRAPHIC PRINTING

(71) Applicant: ESKO SOFTWARE BVBA, Ghent (BE)

(72) Inventors: Peter Morisse, Bornem (BE); Wolfgang Sievers, Krempherheide (DE)

(73) Assignee: ESKO Software BVBA, Ghent (BE)

( * ) Notice: Subject to any disclaimer, the term of this patent is extended or adjusted under 35 U.S.C. 154(b) by 282 days.

(21) Appl. No.: 16/303,038

(22) PCT Filed: May 26, 2017

(86) PCT No.: PCT/EP2017/062769
§ 371 (c)(1),
(2) Date: Nov. 19, 2018

(87) PCT Pub. No.: WO2017/203034
PCT Pub. Date: Nov. 30, 2017

(65) Prior Publication Data
US 2019/0315141 A1    Oct. 17, 2019

Related U.S. Application Data

(60) Provisional application No. 62/342,475, filed on May 27, 2016.

(51) Int. Cl.
*B41N 1/12* (2006.01)
*H04N 1/405* (2006.01)
(Continued)

(52) U.S. Cl.
CPC .............. *B41M 1/04* (2013.01); *B41N 1/12* (2013.01); *G03F 7/202* (2013.01); *G03F 7/2053* (2013.01); *H04N 1/405* (2013.01)

(58) Field of Classification Search
None
See application file for complete search history.

(56) References Cited

U.S. PATENT DOCUMENTS 6,213,018 B1   4/2001   Samworth
6,492,095 B2   12/2002  Samworth
(Continued)

FOREIGN PATENT DOCUMENTS

CN   101416481 A   4/2009
CN   101416842 A   4/2009
(Continued)

OTHER PUBLICATIONS

Japanese Notice of Reasons for Rejection for Japanese Application No. 2019-514857, dated Apr. 7, 2020 with translation, 16 pages.
(Continued)

*Primary Examiner* — Joshua D Zimmerman
(74) *Attorney, Agent, or Firm* — RatnerPrestia

(57) ABSTRACT

A process for creating a flexographic plate or a mask for producing a flexographic plate, including providing a screen having a resolution defined by a base pattern of equally sized screen spots, each screen spot comprising a smallest exposed discrete element represented on the screen. In at least a non-solid tonal portion of the plate or mask, the size of physical spots are selectively modulated such that each set of four neighboring physical spots in the base pattern has an unexposed area centered therebetween. Each screen spot in the base pattern may be an exposed pixel surrounded by 8 unexposed pixels, each physical spot corresponding to the resolution of a laser beam for exposing the spots on the mask, in which the imaging step includes boosting power of the laser beam for isolated pixels relative to non isolated pixels. Mask and plates, and imaging systems for creating them, are also disclosed.

28 Claims, 10 Drawing Sheets

(51) Int. Cl.
*G03F 7/20* (2006.01)
*B41M 1/04* (2006.01)

(56) References Cited

U.S. PATENT DOCUMENTS

| | | |
|---|---|---|
| 6,507,666 B1 | 1/2003 | De La Torre |
| 6,532,082 B1 | 3/2003 | Dewitte |
| 6,701,847 B2 | 3/2004 | Weichmann |
| 6,731,405 B2 | 5/2004 | Samworth |
| 6,741,735 B2 | 5/2004 | De La Torre |
| 6,989,913 B2 | 1/2006 | Asai |
| 7,057,766 B1 | 6/2006 | Inoue |
| 7,580,154 B2 | 8/2009 | Samworth |
| 7,626,730 B2 | 12/2009 | Tai et al. |
| 7,830,569 B2 | 11/2010 | Tai et al. |
| 8,132,508 B2 | 3/2012 | Samworth |
| 8,399,177 B2 | 3/2013 | Stolt et al. |
| 8,493,627 B2 | 7/2013 | Kerz |
| 8,654,400 B2 | 2/2014 | Cave |
| 8,693,061 B2 | 4/2014 | Sanger |
| 2002/0083855 A1 | 7/2002 | Samworth |
| 2002/0101617 A1 | 8/2002 | Nagae et al. |
| 2005/0157347 A1 | 7/2005 | Dewitte |
| 2006/0096479 A1 | 5/2006 | McCrea et al. |
| 2010/0143841 A1 | 6/2010 | Stolt et al. |

FOREIGN PATENT DOCUMENTS

| | | |
|---|---|---|
| CN | 101867680 A | 10/2010 |
| EP | 1557279 A2 | 7/2005 |
| JP | 2002211097 A | 7/2002 |
| JP | 2003163806 A | 6/2003 |
| JP | 3655013 B2 | 12/2006 |
| JP | 2008000927 A | 1/2008 |
| JP | 2011120114 A | 6/2011 |
| JP | 2012511175 A | 5/2012 |
| WO | 2010077274 A1 | 7/2010 |

OTHER PUBLICATIONS

Anonymous, "Imaging Engine 14.1 User Guide", Aug. 1, 2015, retrieved from the internet: https://docs.esko.com/docs/en-us/automationengine/14.1/userguide/pdf/ImagingEngine_141.pdf—149 pages.

International Preliminary Report on Patentability for International Application No. PCT/EP2017/062769, dated Nov. 27, 2018—10 pages.

International Search Report and Written Opinion for International Application No. PCT/EP2017/062769, dated Sep. 12, 2017—12 pages.

Kodak, "Kodak Flexcel NX System," Sep. 22, 2015 (document creation date as listed in PDF metadata), 6 pages.

Chinese Office Action for Chinese Application No. 201780046434.7, dated Nov. 26, 2020 with translation 13 pages.

Grapholas 14.0 User Manual. Aug. 27, 2014, Esko, 47 pages.

AM dot tile

Scaled by 2 = DDWSI

X' = 2*X
Y' = 2*Y

Rotated by 45o = WSI

X' = 2*X + 2*Y
Y' = 2*X - 2*Y

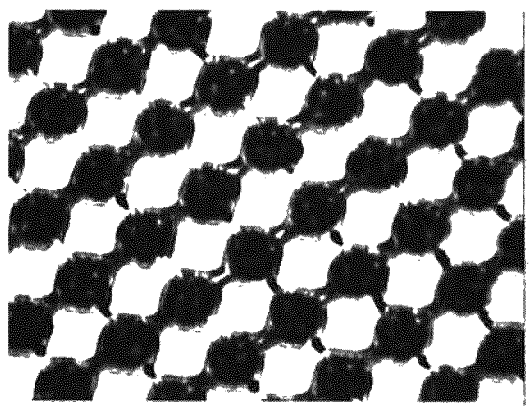 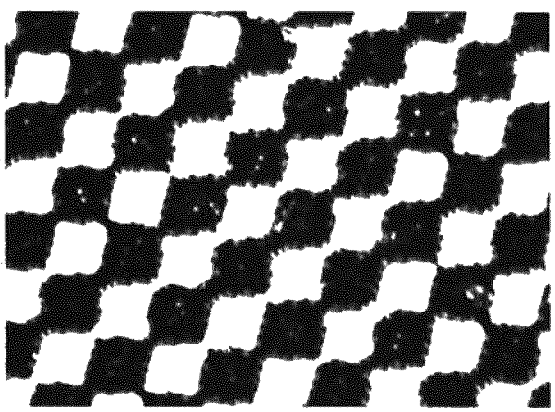
FIG. 10A	FIG. 10B
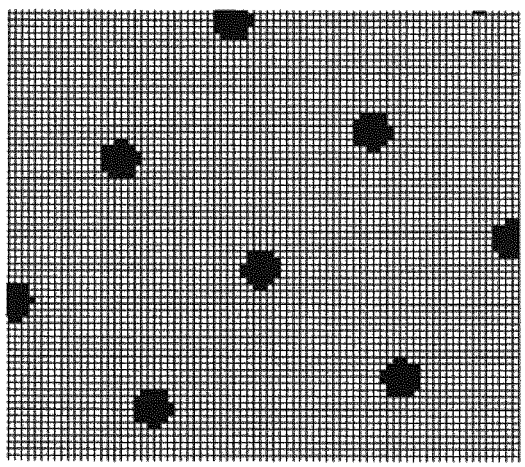 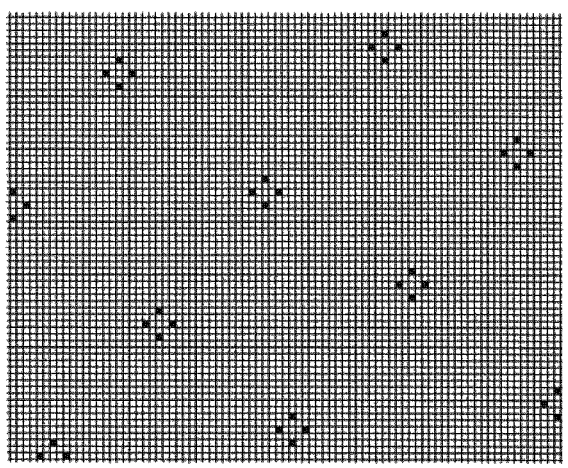
FIG. 11A	FIG. 11B

METHOD FOR SMOOTHER TONAL RESPONSE IN FLEXOGRAPHIC PRINTING

CROSS REFERENCE TO RELATED APPLICATIONS

This application claims priority to PCT Application Ser. No PCT/EP2017/062769, filed May 26, 2017, which claims priority from U.S. Provisional Application No. 62/342,475, filed May 27, 2016, which are herein incorporated by reference in their entireties.

BACKGROUND OF THE INVENTION

The invention relates to printing, more specifically to flexographic printing, and methods, and systems for implementation of such methods, for improving the tonal response curve of a printing plate, including plate making methods.

Traditionally, flexographic plates have a flat upper level surface for printing solid areas, a flat lower surface for leaving the substrate unprinted and a number of mathematically organized printing dots at the upper level (the level that physically touches the printing medium onto which the printed image is transferred) with a size corresponding to the density to be reproduced. One printing method is called AM (amplitude modulated) and is characterized by having a fixed number of dots per linear inch, called the screen ruling or lineature. Over time, many variations have been developed, including stochastic screening (also known as FM screening, in which the dots have a fixed size and the density or frequency of the dots is modulated) and hybrid AM/FM screening in which typically the highlights have a stochastic pattern and the rest follows the traditional AM pattern.

Methods have also been developed to improve the solid rendering by replacing the flat surface with a modulated surface. Several modulation patterns are now in common use, including a multitude of square or round 'white' cells, organized in a mathematical grid or more stochastically, lines/grooves and, more recently, very high resolution patterns or textures which may bring less than 50% of the plate to the highest level.

As a consequence of the research to find the best solid rendering patterns, and with the improvement of the imaging equipment (notably far-level control over microscopic results of the resulting plate), remarkable solid boosts have been realized. It is not an exception to boost up densities with 0.3 on the density scale (for example, realizing a cyan density of 1.2 without solid patterns and of 1.5 with solid patterns). In addition, these improvements also lead to a color shift, typically towards a hue closer to the theoretical hue of the ink. This is caused by a thinner ink layer, which is now commonly accepted to be the consequence of high frequency modulation.

This realized benefit however creates a new problem: the remarkable boost of the solid rendering creates a strong discontinuity between the solid and the near-solids. This discontinuity is visible in both synthetic gradations (as for example made via the gradation functions of Adobe Illustrator or other applications generating PDF gradation structures) and in continuous tones (where different separation methods unavoidably assign certain regions the highest possible density for a given ink, and other, often close-by regions, densities smoothly just below it). The human eye is extremely sensitive to this discontinuity. Consequently, this problem leads to rejection of printed artwork.

Several mitigations for this discontinuity problem have been presented and are in popular use. One such mitigation is to not use solid patterns where a smooth gradation is needed. This means in practice that an algorithm or a human operator decides what to treat as solid (to be boosted) and what to treat as non-solid. One method is to only accept synthetic flat tints as solid and all the rest (contones, gradations) as non-solid. This is a simple and reasonably practical method (some RIPs allow to do this automatically). A disadvantage of this method, however, is that the benefits of the rendering boost may be missed in important places. For example, without a boost, contones may continue to print 'dull', i.e. with a limited tonal range. Highly saturated colors may not be reached because saturated colors often including at least one printing ink having a high density. Finally, many designs stitch flat regions to variable regions. The synthetically different treatment of the flat tints compared to the other regions again may show a discontinuity in the final printed result. Detecting discontinuities of this type may require scanning the entire page description with a highly specialized (typically slow) algorithm, and even when detected, there may be no suitable solution.

Another mitigation for the discontinuity between solid and near-solid regions is proposed in EP155727951 (Dewitte), in which in at least one embodiment, solid patterns, more specifically grooves, fade into the screened areas. This mitigation can also be tailored to avoid potentially undesired side effects, such as the generation of moiré patterns. Mathematics teach that the combination, of 2 patterns with different frequencies and/or angles may generate a third pattern of a lower ruling and angle. This moiré pattern may be rejected by print buyers as it is often very noticeable to the human naked eye. Dewitte's method solves this by putting the solid rendering pattern at a 'rational multiple' of the original pattern, i.e. the solid rendering pattern is chosen such that the moiré generated with the original screen pattern sits at the same frequency and angle as the original screen. Assuming that the original screen is acceptable to the human eye, the combined effect is also typically acceptable.

But, given that very well calculated frequencies and angles for the solid boosting pattern generally must be chosen to avoid moiré patterns, the chosen frequencies and angles for avoiding moiré patterns may not be optimal for solid boosting. In general, non-moiré-generating patterns on average may boost the solids by only half as much as the optimal boosting patterns.

Additionally, the highly non-linear behavior of flexographic plate making and printing also mean that when solid patterns fade, into near-solid screening areas, the resulting tonal curve does not always linearly fade, as might be desired. In general, for example, half the pattern may not boost half the density, and it may boost not at all or even work in reverse. Also the addition of the conventional screen dots may disturb the pattern in such a way that it no longer works as desired. Attempts to avoid disturbing the pattern with the screen dots by keeping a protection one between patterns may add yet another complication that risks further disturbing the solid rendering effect.

Another problem very well known in flexography is that of (near) dot touching. The ink rendering of flexography may react very non-linearly when printing dots are within a certain threshold of closeness to one another. Two dots relatively dose to each other may create a 'bridge' in which what should be a non-printing area between the dots is so close to the printing surface that it grabs ink, sometimes even more ink than the printing areas. This may lead to a strong 'tonal jump' at a hard-to predict density. Until a certain threshold is reached, which threshold may be affected by a number of variables that may not always be known or predictable, ink does not bridge between two adjacent dots. Then, with minimal diminishment of the distance between the dots, the bridge may suddenly form. The bridge formation may be dependent upon, inter alia, printing pressure, the shape of the dot, the anilox properties and pressure, ink viscosity and printing speed.

Aspects of the claimed invention may mitigate the near dot bridging problem at least partially by influencing the shape in such a way that bridging is less abrupt and grabs less ink. Aspects of the claimed invention may simultaneously mitigate the discontinuity between solid and near-solid regions

SUMMARY OF THE INVENTION

One aspect of the invention is a process for creating flexographic plate or a mask for producing a flexographic plate. One step in the process comprises providing a screen having a resolution defined by a base pattern of equally sized screen spots, each screen spot comprising a smallest exposed discrete element represented on the screen. The plate or the mask is created by, in at least a portion of the plate or mask corresponding to a non-solid tonal area of the plate, selectively modulating the size of physical spots on the plate or the mask corresponding to the screening spots such that each set of four neighboring physical spots in the base pattern has an unexposed area centered therebetween. In one embodiment, each screen spot in the base pattern comprises an isolated pixel comprising an exposed pixel surrounded by 8 unexposed pixels. In such an embodiment, each screen spot may comprise a single pixel and each physical spot may corresponds to resolution of laser beam used for exposing the spots on a mask, in which the process further includes imaging the mask with the laser beam. The step of imaging the mask with the laser beam may include boosting power of the laser beam used for imaging each isolated pixel relative to power of the laser beam used for imaging non-isolated pixels. The size of the unexposed area between the four neighboring imaged spots may be optimized by adjusting power of the laser beam corresponding to each imaged physical spot for optimization of ink transfer in press.

The process of defining the screen may comprise defining a first screening supercell, the then for each pixel located at (X, Y) in the first screening supercell, assigning a location (X', Y') in a second supercell by applying a first mathematical formula ($X'=fx(X,Y)$; $Y'=fy(X,Y)$) and then setting values in the second supercell not filled by the first mathematical formula to an empty pixel value. The first mathematical formula adheres to a set of rules comprising (i) X' and Y' are integer numbers, (ii) no two pixels of the first supercell are transformed to a same pixel in the second supercell, (iii) all pixels (X',Y') lie on a high resolution base pattern in which surrounding each pixel (X',Y') are at least empty pixels not filled by the mathematical formula. A first supercell may have a lines per inch (Lpi) and an angle (Ang), such that applying fx(X,Y) and fy(X,Y) may create in the second supercell a line per inch (Lpi'=f3(Lpi) and an angle (Ang'=f4 (Ang)). For a desired Lpi and desired Ang for the, second supercell, a reverse transformation formula ($Lpi''=f3^{-1}$(desired Lpi); $Ang''=f4^{-1}$(desired Ang)) may be applied, thus creating a screen having a lines per inch Lpi" and an angle Ang".

A plurality of screens, each corresponding to an ink color, may be created, by calculating, for a desired lines per inch and angle for the set, Lpi" and Ang" for each screen; identifying a closely matching ruling/angle set that is free of second order moiré; generating a plurality of first screening supercells corresponding to the closely matching ruling/ angle set; and converting each of the plurality of first screening supercells to corresponding second screening supercells. The second supercell may be created to have a size and a desired ruling and angle, with a third supercell created having the same size and the same desired ruling and angle as the second supercell, the third supercell corresponding to screen configured to improve highlights, wherein the second and third supercells may be merged into a fourth supercell. This merger may be accomplished by performing an operation comprising, (a) for each pixel, determining a cell to which the pixel belongs; (b) based upon the determined cell, determining from which of the second and third supercells to copy information, and (c) copying the information into the fourth supercell from the second or third supercell as determined in step (a). The determination in step (b) may be random, including but not limited to random determination performed using a blue noise determination, or it may be systematic. The process may comprise copying information from the second supercell at relatively higher tonal densities and copying information from the third supercell at relatively lower tonal densities, and steps (a)-(c) may be performed for the entire threshold array. The third supercell may be created by applying a second mathematical formula ($X'=fx(X,Y)$; $Y'=fy(X,Y)$), wherein the second mathematical formula is different than the first mathematical formula but adheres to the same rules.

The process may be used in combination with highlight improving techniques, such as by applying the process to an original screen embodying highlight-improving techniques in at least a portion thereof, or switching to solid AM dots certain highlight levels.

Another aspect of the invention includes a flexographic plate, or mask for making a flexographic plate, produced by any of the processes described herein. The resulting plate or mask may have one or more regions having a first high resolution base pattern and one or more regions having a second high resolution base pattern.

Yet another aspect of the invention comprises an imaging system, such as an imagesetter, for producing a mask for making a flexographic plate. Such an imaging system comprises a laser source configured to expose portions of a mask to radiation corresponding to discrete spots identified in an imaging data file, the laser source having an adjustable laser power for modulating imaged spot size on the mask. The imaging system also comprises a controller, comprising a processor configured to receive and convert imaging data into operating instructions for the laser source, the imaging data comprising a screen having a resolution defined by a base pattern of equally sized screen spots, each screen spot comprising a smallest exposed discrete element represented on the screen. The controller is configured to create the plate or the mask by, in at least a portion of the plate or mask corresponding to a non-solid tonal area of the plate, selectively modulating the size of physical spots created by the laser on the mask corresponding to the screening spots such that each set of four neighboring physical spots in the base pattern has an unexposed area centered therebetween. The exposed spots of the imaging data may comprise isolated spots, each isolated spot comprising an exposed spot surrounded by 8 unexposed spots, in which case the controller is configured to identify the isolated spots and instruct the laser source to use relatively greater power for creating imaged spots corresponding to the isolated spots in the imaging data than for creating imaged spots corresponding to non-isolated spots in the imaging data. In particular, the physical spots corresponding to the imaging data may comprise circular spots that do not fully overlap with one another.

BRIEF DESCRIPTION OF THE DRAWINGS

FIG. 10A is a microphotograph of printed dots formed using a plate made using a standard AM screen.

FIG. 10B is a microphotograph of printed dots formed using a plate made using an exemplary screen with dots composed of isolated pixels.

FIG. 11A depicts a screen with conventional AM dots composed of 20 exposed pixels.

FIG. 11B depicts screen with dots each composed of 4 isolated exposed pixels.

DETAILED DESCRIPTION OF THE INVENTION

One aspect of the invention comprises resolving or mitigating the above-mentioned problems by using a screening pattern built up in large parts of the tonal scale from a very high resolution base pattern of discrete imaging spots which are exposed with an adapted (typically higher) laser power than has been traditionally used in the field. The actual screen shape (such as a circular dot) then becomes a virtual shape in the digital film and on the printing plate, leading to an actual printing dot which has less of the above mentioned disadvantages, and in addition creates a smooth gradation to the boosted solid.

Figure 1A:
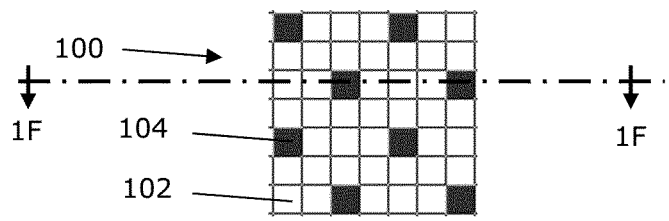
FIGS. 1A-1E each depict exemplary high-resolution base patterns.
Figure 1B:
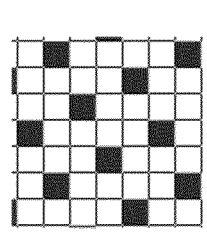
Figure 1C:
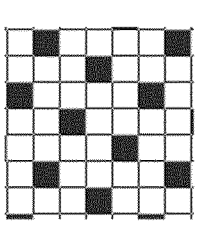
Figure 1D:
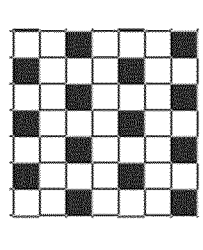
Figure 1E:
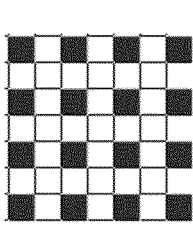
Figure 1F:
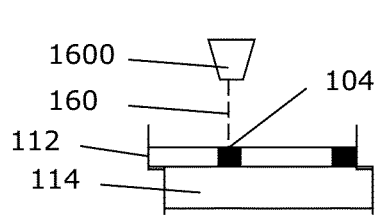
FIG. 1F schematically depicts a portion of an exemplary mask on an exemplary plate in cross section through line 1F-1F of FIG. 1A during an exemplary imaging process.
Figure 1G:
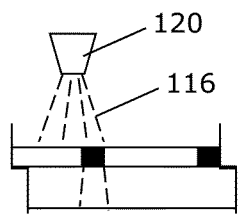
FIG. 1G schematically depicts an exemplary process of exposing the plate to UV radiation through the imaged mask of FIG. 1F.

In the preferred embodiment, the high resolution base pattern may be equal to the pattern used for solid rendering. One such pattern is illustrated in FIGS. 1A, 1F and 1G. The square grid 100 is the imaging system high resolution grid (for example 4000 ppi). A laser source 1600 images the black spots 104 and does not image the white spots 102. Consequently, on a mask 112, such as a LAMS layer, the black spots correspond to areas of the LAMS masking layer that are ablated with laser energy 160, leading to these ablated areas of the mask allowing radiation to pass through them when the mask/plate combination is exposed to UV radiation 116 from a UV head 120 of a UV exposure system in an exposure step, thus creating a dot formation in the plate 114. Dot formation can be optimized, with respect to ink transfer in the printing process, by adjusting the size of the ablated black spots through adjusting the laser power. The solid ink density (SID) can be optimized by selecting a size for the black spots that corresponds to a peak in SID for a particular set of operating conditions (ink viscosity, materials of construction of the substrate to the receive the ink, etc.). The white areas 102 are not ablated and lead to formation of the plate surface below the uppermost level. However since the frequency is so high, the lower surface of the white areas is still very much above the lower level of non-printing. In reality, the height difference between the white and black zones may only be about 50 micrometers (whereas the total relief is often >500 micrometer).

The pattern illustrated in FIG. 1A is only one of many patterns which have been found to create very high solid densities, if and only if the black spots are imaged with a well-adjusted laser power, as is well known in the art. The patterns illustrated FIGS. 1B-1E may be used in the same way as described with respect to FIG. 1A, above, as long as the patterns have black dots which are discrete from each other (meaning that none of the 8 pixels surrounding a black dot is black).

Figure 2:
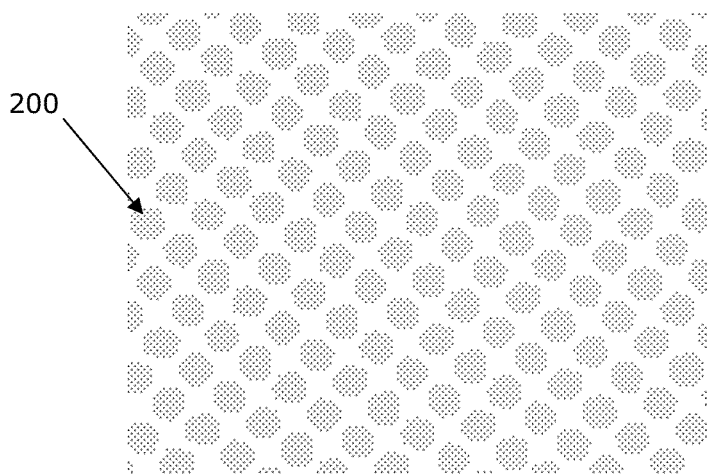
FIGS. 2 and 3 each depict an exemplary screened areas formed from exemplary high-resolution base patterns.

Solid areas just follow the base pattern. For screened areas, imaging still only happens on the black spots determined by the high resolution grid. However in order to make a lower density, some of the black spots are no longer imaged, (while still all white spots are always non-imaged). This creates screened areas as shown in FIG. 2, in which each cluster 200 of black spots 104 (each representing, e.g., 1 shot of laser power) is analogous to a traditional "screening dot" as would have been rendered in accordance with the prior art. After creating a plate and printing these dots, a printed dot will be created which will get closer to the shape of a prior art printing dot, but with better properties.

The advantage can be understood from studying the actual typical printed shape of a flexographic printing dot, such as, for example, on a plastic substrate, as shown in FIGS. 10A and 10B, which figures show microphotographs of patches of dots printed on film in black ink using gray levels (not color) in midtones (ink-bridging) FIG. 10A shows dots formed using a standard AM screen. FIG. 10B shows dots formed using an exemplary screen as described herein.

Influence on Dot-Touching Tonal Jump

Figure 3:
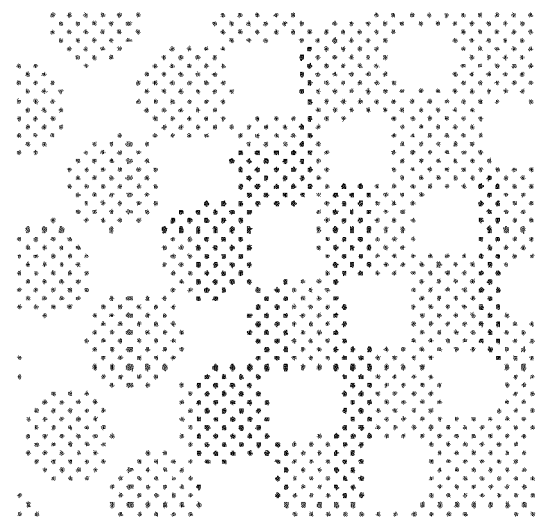

Referring now to FIG. 3, whereas the human imagination continues to seeing the bridging behavior of the dots, the actual printing spots are never contiguous (because the spots are imaged on the high resolution, discrete grid). Testing on many substrates shows this diminishes ink-bridging. While some bridges may still be formed, such bridges do not grab the excessive amounts of ink typically associated with a traditional approach where each screening dot is rendered as a solid.

By providing 8 empty pixels around each lasered pixel, the resulting pattern does not cover the plate area, by design. Experiments have shown, however, that the best solid rendering is reached by optimizing the laser power applied to the dispersed pixels. In fact, the laser power and the pixel pattern ideally should be adjusted to each other. The fact that the pixels are dispersed permits such adjustment with few, if any, drawbacks. Imaging systems can either just optimize laser power (typically higher power than normally used) for the entire plate, if the entire plate includes dispersed pixels as described herein, or more advanced systems can auto-detect regions with a need for optimized laser power based on the fact that the dots are dispersed and on the expected locations. Methods for adjusting laser power are known in the art, such as PixelBoost functionality available in Esko's Grapholas user interface, using, for example, an Esko CDI imager upgraded to the "UV Flattop Option", such as equipped with a standing UV head and a Gradient Index (or an Asphere) lens, a drum having a LUST servo drive, using a "Flattop" exposure profile in connection with a "High Res" option, such as described, for example, in the Esko Technical Memo titled "Upgrade to Flattop/Round top Option" Rev. 4, dated Mar. 11, 2011, in herein by reference. The foregoing features are also standard in Esko's CDI Crystal systems.

Figure 16:
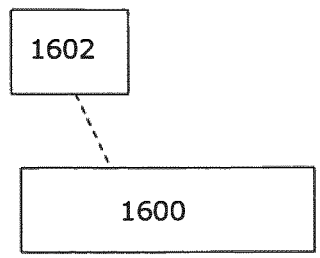
FIG. 16 is a schematic illustration of an imaging system.

A portion of an exemplary imaging system is depicted in FIG. 16, comprising a laser source 1600 and a processor 1602 for controlling the laser source, memory 1604 for storing an imaging data file corresponding to the screens as described herein. Laser source 1600 has adjustable laser power for modulating the imaged spot size on a mask. Controller 1602 typically comprises one or more computer processors programmed with instructions, and may also comprise hardware controls. The controller is configured to receive and convert imaging data into operating instructions for the laser source, which in accordance with aspects of the invention may include selectively modulating the size of physical spots created by the laser on the mask. Thus, for imaging data comprising a screen having a resolution defined by a base pattern of equally sized screen spots, each screen spot comprising a smallest exposed discrete element represented on the screen, the laser creates physical spots on the mask corresponding to the screening spots. As is known in the art, the mask is then used during a UV exposure step for exposing the plate, which is then further processed to form a completed plate. Plates or masks created by the processes described herein result in a plate in which each set of four neighboring physical spots in the base pattern have an unexposed area centered therebetween. The "smallest exposed discrete element represented on the screen," may be a pixel, such as in a system as described herein that utilizes isolated pixels, or may be a collection of pixels corresponding to the smallest dot utilized in a low resolution screen. In the case of a system utilizing isolated pixels, the controller is configured (in software and/or hardware) to identify isolated pixels and boost them sufficiently to leave an unexposed portion centered among each set of four exposed isolated pixels. In the case of a system that uses a lower resolution screen, the system may be configured to modulate the laser power associated with each pixel such that each collection of 4 smallest exposed discrete elements (e.g. dots) has the appropriate unexposed portion among them, without a need for the controller to identify isolated pixels.

A screen as described herein may be constructed by taking a conventional screen and perforating it with the desired high resolution base pattern. Perforation may entail, for example, an algorithm in which each pixel of the conventional screen is compared to the corresponding pixel of the high resolution pattern. If both are black, the resulting pixel will be black; in any other case, it will be white. The described method corresponds to a process that may be achieved by superimposing films or by using a hardware device that is programmed only to image filled pixels in accordance with the high resolution base discrete pattern (and therefore ignoring any other black pixel).

While being easy to implement, the foregoing method may have some disadvantages. The first disadvantage may be generation of an unwanted moiré pattern. Modern high-quality screen dots are designed carefully to create more or less equal surface of the dot and more or less mathematically correct average location of the dot. Removing pixels according to the high resolution pattern may cause certain dots to lose/keep more pixels than others, with a slight shift in average location. This may happens rather systematically according to the mathematical interference pattern between the original screen and the high resolution base pattern, which interference pattern may become visible to the human eye, leading to rejection of the printed result.

A second disadvantage may be a loss of grey levels. In the simplest case, screens may have as many grey levels as there are pixels in one printing dot. In more complex approaches, additional grey levels are created by modulating the printing dots in size such that the average grey level of the total goes up in much smaller steps (at the cost of a slight modulation added to the pattern, at risk of being visible). In practice, such modulation is applied using a blue noise pattern, such that the visibility of the modulation is minimized. However, the super-imposed blue noise pattern may break the rules of the game. Based on the systematics of the interference, certain grey levels may risk losing all their added dots while other grey levels may keep all their added dots. This results in 'staircasing': some steps are strongly compressed while others are expanded.

A screen may be ideally constructed, however, without the foregoing disadvantages while still producing the expected rulings and angles. The subject screen construction method uses a transformation from a specially designed base screen at a different ruling, angle and resolution. This screen is transformed via a method as discussed below into the wanted screen with the requested rulings and angles.

The operations discussed below are preferably implemented on a screen supercell (also known as a threshold array). The preferred embodiment uses supercell screening using a threshold array. Comparable results can be reached with other screening methods by applying the same logic, but whereas some methods may require RIPping the page description at a different resolution and angle, the supercell method does not have such a requirement.

Figure 4A:
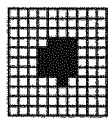
FIG. 4A illustrates a conventional supercell with a conventional AM dot.
Figure 4B:
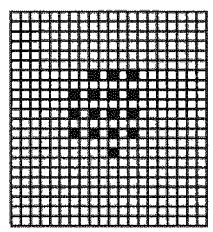
FIG. 4B illustrates a supercell with a corresponding dot defined by an exemplary high-resolution base pattern.
Figure 4C:
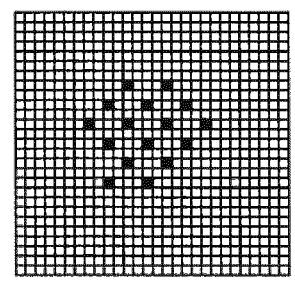
FIG. 4C illustrates a supercell with a corresponding dot comprising another exemplary high-resolution base pattern.

FIGS. 4A-4C illustrate a transformation for converting a conventional supercell into a supercell suitable for implementing the current invention. FIGS. 4A-4C illustrate a supercell having only 1 screen dot for the ease of explanation, but the same logic can be applied to supercells of any size or angle. Also, the explanation is provided with references to a pure bitmap, whereas a supercell has a threshold value for each pixel, this does not change the logic, and it also illustrates that the method may also be applied for bitmap array screening methods.

FIG. 4B illustrates an example that utilizes a very high resolution pattern called DDWSI. FIG. 4C illustrates an example that utilizes a slightly lower pattern at 45 degrees, called WSI. In the DDWSI example, for each pixel in the original supercell, the location in the new supercell is found by applying a mathematical formula of the shape $$X'=fx(X,Y)$$

$$Y'=fy(X,Y)$$

The value of found new supercell pixel equals the value of the original supercell pixel. For binary input, the output is binary. For threshold arrays, the threshold value is copied. This will not fill the entire new supercell. The non-reached pixels are set to white (in case of a binary bitmap) or to the maxThresholdValue+1 in the threshold array (indicating pixels which will never turn black).

Functions fx and fy have following properties:
The results X' and Y' are integer numbers
Different inputs lead to different outputs (no 2 pixels of the original grid are transformed to the same pixel in the output grid)
All output pixels (X',Y') lie on the high resolution base pattern,
Around each output pixel are 8 pixels that are never reached by the transformation.

The couple of functions (fx,fy) therefore determine the high resolution base grid. Shown in FIGS. 4B and 4C are two such function couples that create the results shown for the input dot of FIG. 4A.

The functions are
DDWSI pattern (FIG. 4B);

$$Fx(X,Y)=2X$$

$$Fy(X,Y)=2Y$$

WSI pattern (FIG. 4C);

$$Fx(X,Y)=2X+2Y$$

$$Fy(X,Y)=2X-2Y$$

In some cases, the shape of the virtual dot is largely kept, while in other cases the shape undergoes a bigger change. However, following are generally true:
2 equal sized dots convert to 2 equal sized virtual dots (each having the same number of black spots)
Contiguous dots convert to dots with a 'virtual' contiguity. Approximations of a circle will convert to approximations of a circle. The same is true for squares and even for stochastic patterns with certain approximate features.

Figure 5:
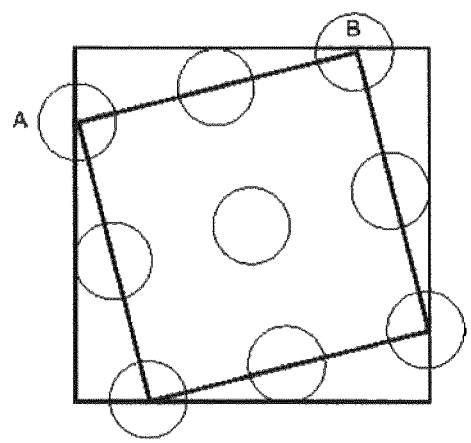
FIG. 5 illustrates a supercell.

The foregoing operations are performed for each pixel in the supercell, leading to a new supercell which is generally larger than the original supercell. When the original supercell is characterized by 2 natural numbers A and B (as shown in FIG. 5), then the new supercell can be found by taking the outer bounds of the converted pixels.

EXAMPLE

Exemplary computer code for performing the foregoing operations follows:

```
Tile CreateWSITile(Tile const & inOriginalTile)
{
    // 1. Calculate tile geometry parameters of WSI tile,
    //    based on original tile geometry
    int A_WSI = 2 * inOriginalTile.A + 2 * inOriginalTile.B;
    int B_WSI = 2 * inOriginalTile.A − 2 * inOriginalTile.B;
    int M_WSI = inOriginalTile.M;
    int N_WSI = inOriginalTile.N;
    // 2. Create WSI tile and reset thresholds of all pixels to maxlevel
    //    (pixels will never be switched on)
    Tile WSITile(A_WSI, B_WSI, M_WSI, N_WSI);
    for (int v_wsi = 0; v_wsi < A_WSI + B_WSI; v_wsi++) {
        for (int h_wsi = 0; h_wsi < A_WSI + B_WSI; h_wsi++) {
            // verifies if coordinates are within the tilted WSI tile
            if (!WSITile.IsWithinTileBound(v_wsi, h_wsi))
                continued;
            // set threshold of pixel at coordinates v,h to maximum threshold;
            //    the pixel will never be switched on
            WSITile.thresholds[v_wsi][h_wsi].SetToMaximum( );
        }
    }
    // 3. Copy each threshold of the original tile to WSI tile
    for (int v_orig = 0; v_orig < inOriginalTile.A + inOriginalTile.B; v_orig++) {
        for (int h_orig = 0; h_orig < inOriginalTile.A + inOriginalTile.B; h_orig++) {
            // verifies if coordinates are within the tilted original tile
            if (!inOriginalTile.IsWithinTileBound(v_orig, h_orig))
                continued;
            // copy threshold of the pixel from the original tile
            // 'Threshold' of one pixel in the tile can be a single value,
            //    a function or multiple threshold values (multi-threshold pixels)
            Threshold th_Orig = inOriginalTile.thresholds[v_orig][h_orig];
            // translate coordinates to WSI tile
            in v_wsi = 2 * (v_orig + h_orig);
```

```
            in h_wsi = 2 * (v_orig - h_orig);
            // normalize the coordinates v_wsi and h_wsi to be within
            // the tilted tile geometry of the WSI screen
            WSITile.NormalizeTiltedTileCoordinates(v_wsi, h_wsi);
            // Copy the threshold
            WSITile.thresholds[v_wsi][h_wsi].SetThreshold(th_Orig);
        }
    }
    return WSITile;
}
```

According to the same logic, the screen ruling and angle will change under operation (assuming equal resolution).

$$Lpi'=f3(Lpi)$$

$$Ang'=f4(Ang)$$

In the example of WSI:

$$f3(Lpi)=Lpi/(2*sqrt(2))$$

$$f4(Ang)=Ang+45 \text{ (assuming angle expressed in degrees)}$$

End users generally do not expect a change of ruling and angle to improve the tonal scale of their printing. The trick now is to apply the reverse transformation formula on the requested screen ruling and angle:

$$Lpi=f3^{-1}(\text{wanted Lpi})$$

$$Ang=f4^{-1}(\text{wanted Ang})$$

This formula gives us for each requested ruling and angle a new ruling and angle from which to calculate (or derive from a database) a conventional screen. The industry has long solved how to create conventional screens at almost any ruling and angle, within reason. In the case of flexography, the requested ruling is often around 150 lpi while the transformation has a scale between 2.5 and 3 (2*sqrt(2) for the WSI case). This leads to the construction of a screen of around 400 lpi on a resolution of 4000 ppi, which is well within reach of current screening technology.

For most patterns (notably the above mentioned WSI and DDWSI) the transformation leads to screens which are already proven to work well. Flexo angles (7.5, 22.5, 37.5, 52.5, 67.5, 82.5) fortuitously transform either on themselves or on other angles in the flexo set (f.e. 22.5 transforms to 67.5, for which a screen set already exists).

Transformations with a larger scaling effect may become unpractical, but are also mostly of less interest because they correspond to lower solid pattern frequencies, which produce less density boost.

The disclosed method thus has following features:
Any ruling or angle can be reached
No moiré effects caused by systematic loss of pixels or displacement of pixels
The solid pattern is equal to the pattern determined by the transformation if and only if the conventional screen from which it is converted is entirely black at 100% (as is normally the case).
No pixel other than those determined by the high resolution grid is ever 'black'. This means that all dots in the resulting digital film are 'discrete', meaning that all of its 8 neighboring pixels are white.
The virtual shape of the new screen resembles the shape of the original screen within the limitations imposed by the pixels 'allowed' to be imaged.

Avoiding Color Superimposing Moiré

When creating 3 screens for the colors CMYK, it is well-known that the rulings and angles must be chosen carefully so that the resulting interference pattern is free of second order moiré. Formulas for this can be found in, e.g., U.S. Pat. No. 5,155,599 to Delabastita, incorporated herein by reference in its entirety.

Because the disclosed transformation changes ruling and angle, it risks introducing moiré between the colors if not performed carefully. The following algorithm avoids introducing moiré:
a) Start with the requested ruling and angle set;
b) Convert this according to above mentioned formulae;
c) For this set, find a closely matching ruling/angle set which is free of second order moiré. Depending of which techniques used, this is generally possible with deviations <1% on ruling and <0.1 degree n the angles;
d) Generate the 3 screens;
e) Convert the 3 screens according to above algorithm.

The foregoing approach works because the moiré frequencies of the converted screens are converted in the same way as the original frequencies (for pure reasons of mathematical linearity of the interference formulae). The formula by Delabastita mentioned above refer to a moiré period, which is in fact infinity (the 0 in the equations points to the frequency of the moiré, and the period is the inverse of this). The conversion will then divide the moiré by the frequency conversion factor (2*sqrt(2)) for WSI. Because dividing infinity by any real number remains infinity, the converted screen set is also free of second order moiré.

An important detail is the form of the rosette. This is determined by a linear shift of the centers of the dots compared to each other. Putting all dot centers on top of each other at origin creates a dot-centered rosette, while the more accepted clear-centered rosette demands a shift of one of the colors (mostly black) over half the diagonal of the cell square. Since all distances are transformed with the frequency factor and angle shift, this is also done for the rosette shift distance.

Alternative Constructions

Many alternatives to the above method can be constructed. For example, in a first alternative embodiment, a simple method for creating a high resolution base pattern may be combined with other aspects of the enhanced methods described herein. For example, a simple duplication formula (X'=X*2, Y'=Y*2) may be followed by a perforation method. The result combines good and bad from both methods and must be seen as a compromise. In a second alternative embodiment, an entirely new screen can be calculated that applies the best practices of screen design to the modified pixel grid. Indeed, screen design best practices are generally developed for pure square pixel grids but their goals can mostly be easily transferred to other grids. For example an attempt to keep all screen dots of equal size can be executed on alternative pixel grids. Managing the Fourier transformation of the screen is only marginally more complex than the method described above, and is not a problem for contemporary computer power.

The method as described herein works on all grey levels, and consequently can be used across the entire tonal range. But, use over the entire tonal range is not necessary. Certain users may want to apply the technique only to a certain degree, and not, for example, in extreme highlights. In preferred embodiments, the technique is applied at least in the region from 100 to 20%. Below 20%, printing circumstances may dictate whether to use the technique described herein, to use a highlight-improving technique known in the art, or a combination thereof.

Thus, a method including highlight-improving techniques is now described. A simple method is by converting an original screen that already contains highlight-improving techniques (e.g. hybrid screening like Esko Samba screens, Esko PerfectHighlight screens, HDFlexo screens—using FM-like modulation in highlights) to the new screen of this invention.

Figure 7A:
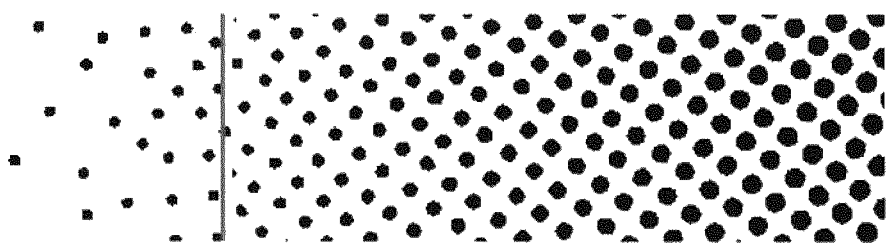
FIG. 7A depicts an original transitional screen in which tones below a critical gray level have been modulated by removing dots.
Figure 7B:
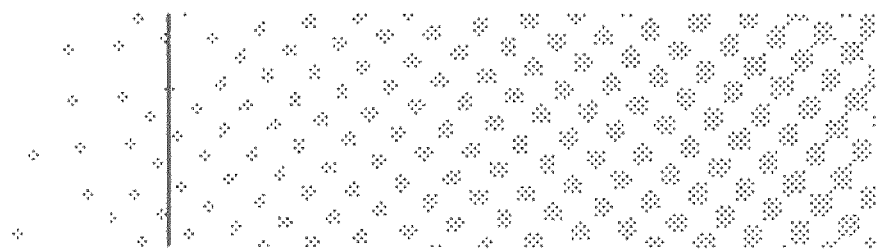
FIG. 7B depicts a new transitional screen after translation of the screen of FIG. 7A to use an isolated pixels.

The new screen formed in accordance with aspects of the invention is created by translating each pixel of the original, therefore also inheriting the dedicated highlight modulation (e.g. virtual FM dots). This is illustrated in FIGS. 7A and 7B, in which the FIG. 7A depicts an original transitional screen (Samba screen-tone below a critical gray level is modulated by removing dots), and FIG. 7B depicting the new screen after translation of the original one, resulting in the same modulation.

Due to the translations to the higher resolution grid, however, the highlight-improvement technique parameters may require scaling (e.g. via a different transition point or minimum dot size). This simple method has the advantage that it does not create discontinuities in the new screen, but it limits the highlights to also use the hi-res isolated pixels.

Another highlight-improving method is by fading in a highlight-improve screen into the new screen for a specific tone range. First calculate a supercell with the desired ruling and angle. Using any prior art highlight-improving technique, calculate an equally sized supercell with the exact same desired ruling and angle. Modern screening techniques can generate the desired prior art screen properties as described, such as for example, using Esko's Screen Manager.

Next, both supercells are combined into a third supercell as follows:
  a) For each pixel, determine the cell to which it belongs. By way of explanation, a is an element of the screen grid, the screen grid being formed by screen ruling and angle. For an AM screen, one cell is the place holder for one single dot. Determining the cell to which the pixel belongs is done by using the pixel coordinates and determining to which grid element these coordinates fall into. Assigning pixels to screen cells is a mathematical operation based on the and angle of the requested screen. An easy way is to assign each pixel to the screen dot center closest to it (taking into account dots which are closer because they repeat over the edges of the super cell). This is prior art used in many screen calculation algorithms.
  b) Based on the cell, determine from which of the two supercells to copy information. This determination can be purely at random, such as using a blue noise determination, or systematically (for example, in a checkerboard pattern).

The foregoing steps may be performed for the entire threshold array or separately for each bitmap array found by intersecting both threshold arrays with the current threshold. In this case, the result will typically no longer be a threshold array and the result will then have to be stored as a bitmap array set and used by a bitmap array screen method in the RIP, which functionality is established in most contemporary advanced PDF RIPs. As is known in the art, a threshold array represents the threshold for each pixel in a repeating tile, the threshold determining the gray level at which the pixel must be switched on or off in the final bi-level output. Such an array can also be represented as an array of bitmaps. Each bitmap then represents the pixels that are switched on for one gray level. So, another way to merge the original supercell with the new one, is to convert both threshold arrays first into bitmaps, one bitmap for each gray level, and then apply the step by merging bitmaps. The new screen is then represented as a series of bitmaps. In alternate embodiments, such as in a more advanced RIP, such as the Esko FlexRIP and Esko Imaging Engine, multi-threshold array bitmaps may be used. In such bitmaps, each pixel can have multiple threshold values (a pixel can switch on and off multiple times at different thresholds). In systems with such capability, merging different screens may result in a single multi-threshold bitmap instead of multiple bitmap arrays.

One embodiment of the previous method includes staying closer to the first supercell at higher densities (for example 20%) and closer to the second supercell at lower densities (for example, close to 0%). In this way, a smooth transition appears between the newly proposed screens and the well-known futures of the prior art highlight-improving screen.

Figure 6A:
FIG. 6A illustrates a portion of an exemplary screen containing combination of "solid" dots and dots defined by isolated pixels.

A possible result is illustrated in FIG. 6A, which illustrates two types of screen dots; dots based on a conventional screen (contiguous dots 600 on the conventional grid) and dots based on the newly proposed screen (clusters 602 of three pixels spaced apart and standing on the dispersed grid).

Figure 6B:
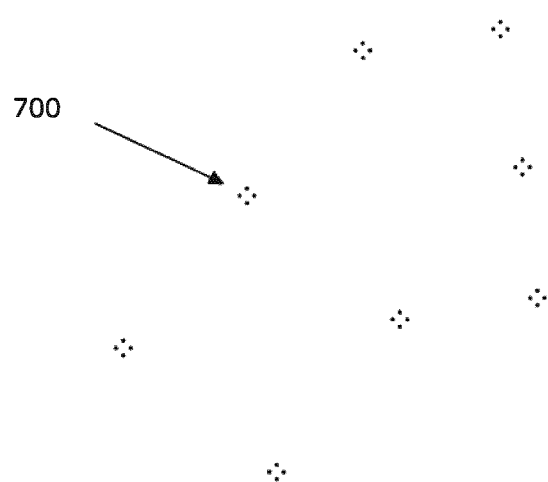
FIG. 6B illustrates a portion of an exemplary screen containing dots defined by isolated pixels in which dots in certain positions have been removed

In another example, blue noise may be applied without a second supercell (or with an empty supercell). The result, illustrated in FIG. 6B, comprises dispersed dusters of dots 700 according to the current invention, spread stochastically over the space. In this method, the highlight effect (FM-like modulation) is implemented on the new screen directly: e.g. To obtain tones below a critical gray level, virtual dots no longer decrease in size, but are gradually removed in a blue-noise way (such as by using Esko Samba screen techniques).

Figure 8:
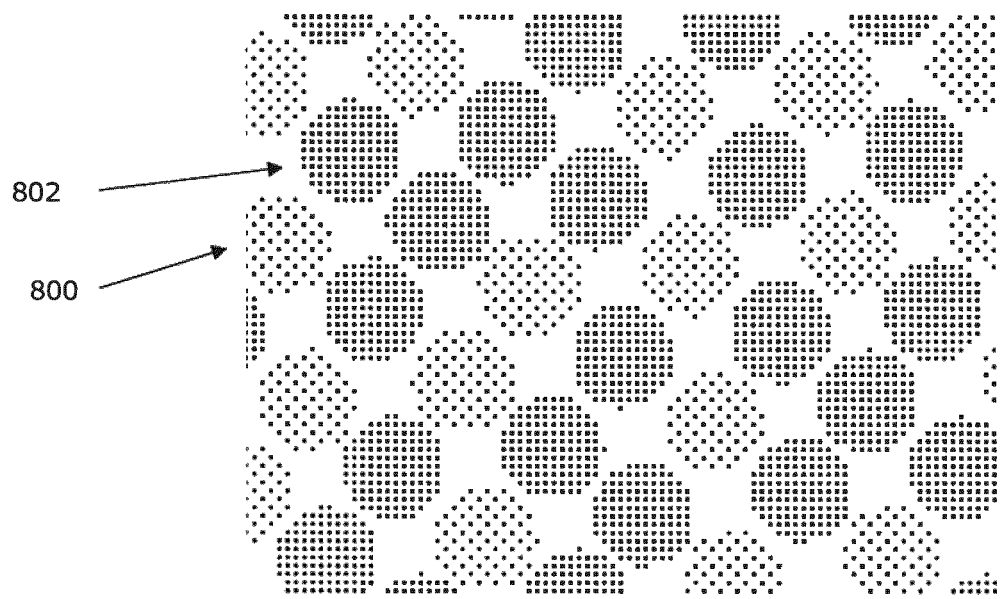
FIG. 8 depicts a screen of combined supercells with two different dispersed grid patterns.

It is also possible to apply different patterns in a mixture. Using the same technique as described above, supercells with two different dispersed grid patterns 800 and 802 may be combined, as illustrated in FIG. 8. In a combination of different patterns, each of the two different dispersed grid patterns correlate to each other, so that combination of the patterns does not violate the disperse rule in the merged screen (every pixel must be isolated). An example of two compatible patterns is DDWSI and WSI pattern: The two patterns translate as:

$$X\_WSI = X\_DDWSI + Y\_DDWSI$$

$$Y\_WSI = X\_DDWSI - Y\_DDWSI$$

These patterns can be merged in at lust the following two ways:
  1. A new screen is generated using translation that converts to WSI. The DDWSI pattern is than merged on a cell-based criteria (e.g. blue-noise: apply DDWSI first to cells that are furthest away from each other), by adding missing pixels in the WSI grid.

2. A new screen is generated using translation that converts to DDWSI. The WSI pattern is than merged on a cell-based criteria, by removing pixels in the DDWSI grid Another method is to combine WSI dots with "normal" solid AM dots starting at a certain threshold. Advantages of a method of combining "normal" contiguous AM dots and "WSI" dots comprising isolated pixels (which reduces the number of exposed pixels by 8), can be understood by referring to FIGS. 11A and 11B. As shown in FIG. 11B, at smaller dot sizes, WSI dots comprise only 4 exposed pixels so only 4 gray levels are possible and the dots are "square" shaped, whereas the conventional AM dots shown in FIG. 11A have 20 pixels, and therefore 20 gray levels, with better ability to approach a more rounded shape.

Figure 12:
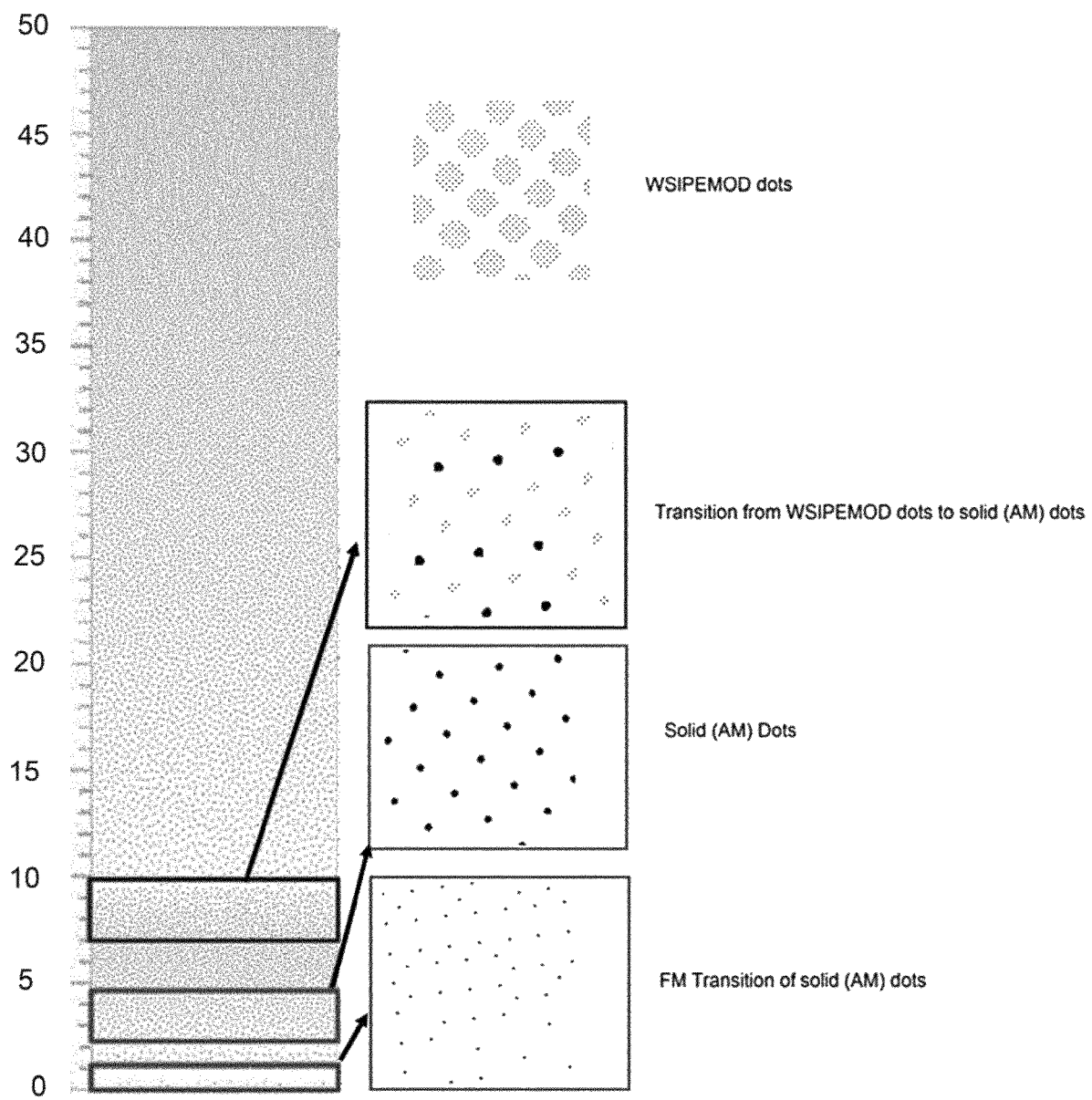
FIG. 12 illustrates an exemplary screen over a large tonal range, with various sections magnified and highlighted.

When the dots becomes smaller than a certain surface, or when the tone to represent gets below a certain threshold, another option is replace the dots with the WSI pattern with solid dots. Ideally, the transition from WSI dots to solid dots should be made in a way that minimizes detection by human eye. One way to do this is to gradually replace WSI dots with solid dots in an optimal distribution such that dots furthest away from each other are replaced first using a furthest distance algorithm. Thus, in the exemplary implementation depicted in FIG. 12, WSI dots begin to be replaced by AM dots at a specific size, namely at the tone at which WSI dots have 6 pixels. Further down the tone scale, WSI dots of 5 and 4 pixels are also replaced by AM dots, with the AM dots also decreasing in size. In even lighter tones, at which only solid AM dots remain, other highlight-improving techniques may be employed, as described herein, including the use of FM techniques with dot removal.

Ideally, the printed dot size of the WSI dot should be equal to the printed size of the AM dot. Therefore a WSI-to-AM-size ratio is identified, which indicates the ratio of WSI dot relative to the AM dot that replaces it (e.g. a ratio of 4:20 indicates a WSI dot of 4 pixels will be replaced with an AM dot containing 20 pixels).

Figure 13A:
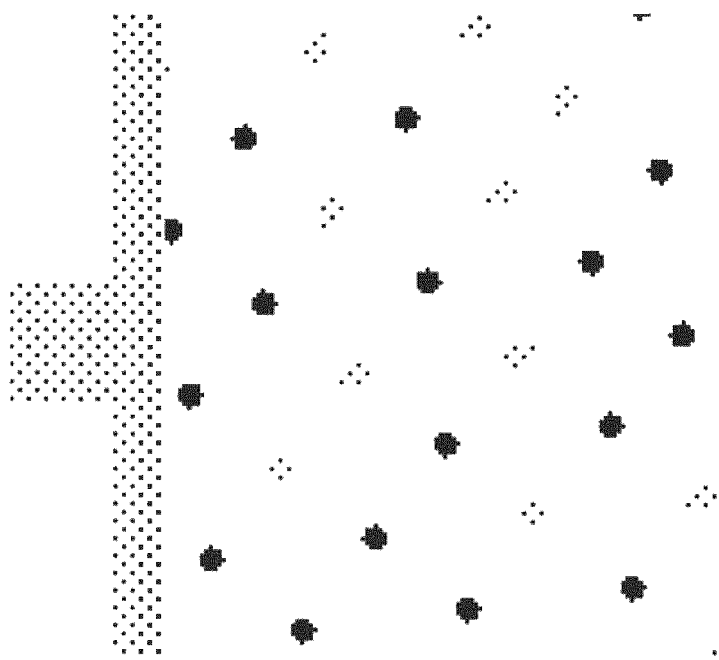
FIG. 13A depicts an exemplary highlight region of a screen composed of a combination of solid AM dots and dots composed of isolated exposed pixels.
Figure 13B:
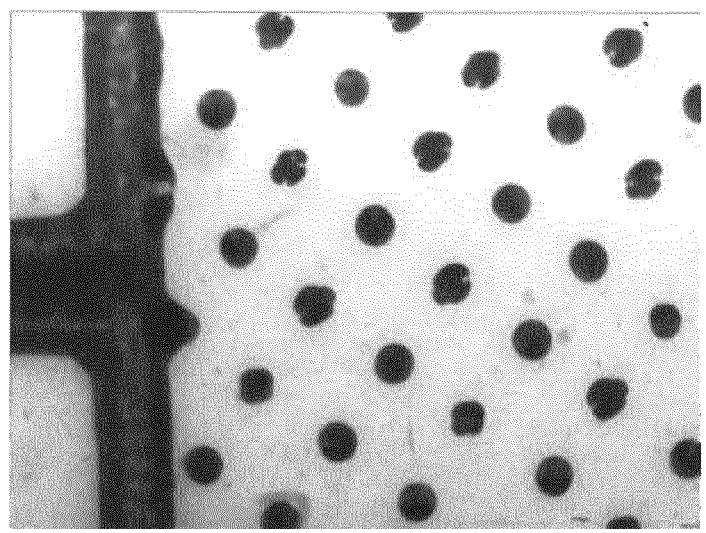
FIG. 13B is a microphotograph of printed dots formed using a plate made from the screen pattern shown in FIG. 13A in accordance with one embodiment of the invention.

This ratio can be dependent on printing conditions and may be determined empirically by printing screens with different ratios, and selecting the ratio that produces no visible transition for a given set of conditions. For example, as shown in FIGS. 13A and 13B, at the ratio of 4:20 for the specific printing conditions used, the solid dots print with dots equal in size to the WSI dots, and the transition is therefore not visible. Highlight effect technologies, such as use of support dots, etc., known for use with solid or AM dots can then be used below the threshold at which all dots are solid.

To mix the WSI and solid dots, the screen may be represented in a multi-threshold array (or in a single multi-threshold bitmap) such that every pixel in the bitmap can have more than threshold level. For example, to represent solid dots in the light tints, pixels must connect to each other and form a specific dot size. To increase tint and dot size, more pixels are switched on at higher thresholds until the WSI/solid transition point, at which point, the dots become a WSI dots that have isolated pixels, so certain pixels are switched off again. The AM dots that replace the WSI dots are placed at the same locations (i.e. dot centers of the AM dots fall on the same screen grid as the centers of the WSI dots). To obtain this, the AM dot may be generated from a spot function, rather than by merging an AM screen to the WSI screen. At each WSI dot center position, an AM spot function determines the proper thresholds so that a specific circular shape is obtained, with the proper tone modulation.

Figure 9A:
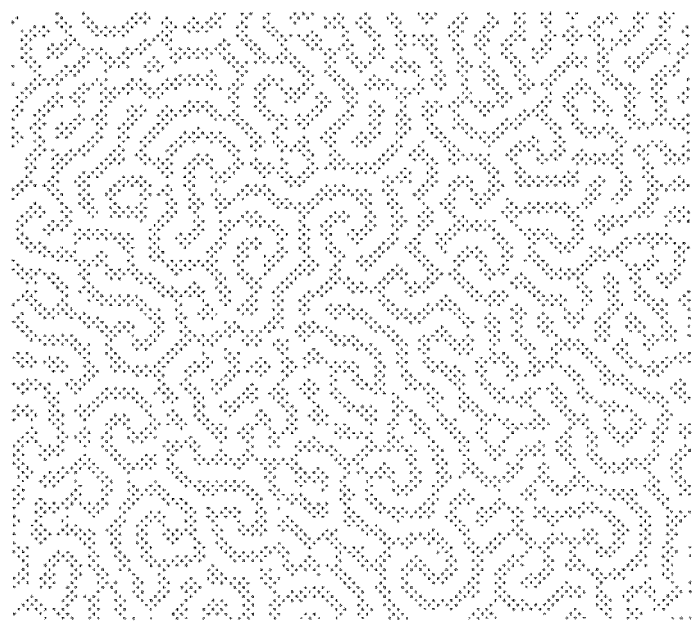
FIGS. 9A and 9B depict exemplary stochastic screens composed of isolated pixels.
Figure 9B:
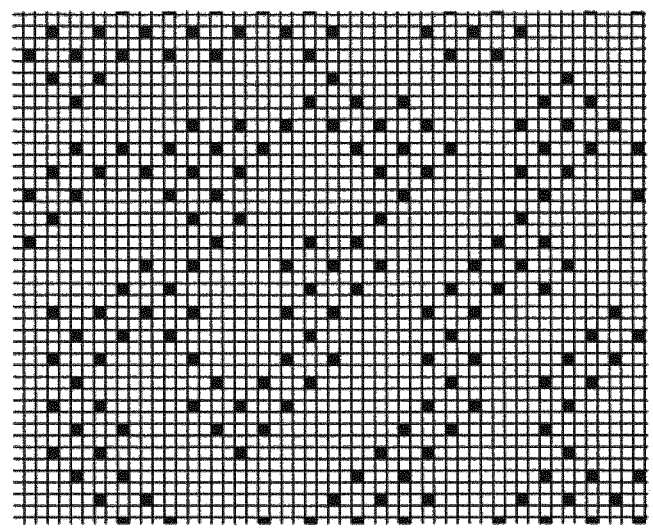

The method is not limited to original AM screens. The described embodiment may be used to perfectly transform a stochastic screening supercell to a new one with all dots on the high resolution dispersed pixel grid. In such embodiments, the 'apparent' ruling will decrease, as it does for AM screening. Therefore, high-frequency patterns, such as are for example used in high quality offset, may be transformed with a much lower frequency result that is more practical for flexography. As shown in FIGS. 9A and 9B, the method may be applied to any supercell screen, to any bitmap array screen, and is easily extended to any shape of screening.

Laser Tuning

The screening patterns described herein having the characteristic base pattern are ideally used in combination with an imaging unit capable of pixel boosting. It should be understood that the laser modulation for controlling the size of each fundamental element (e.g. isolated pixel) of the base pattern can be tuned or optimized to maximize ink retention characteristics for each set of printing conditions (ink, substrate, temperature, etc.). For example, an ESKO CDI unit as described herein may have a controllable amount of boost between 100-400% of laser "normal" intensity (power).

Figure 14:
FIG. 14 depicts a 3×3 structure block used for detection of isolated pixels.

The laser system can be programmed to identify isolated pixels using detection algorithm, such by using a 3×3 structure block as illustrated in FIG. 14. The same structure can be used to identify single-pixel diagonal lines (which may also be boosted) by looking for a center exposed pixel with exposed neighbors located (a) only in both the northwest and southeast corners or (b) only in both the northeast southwest corners.

Thus, screens containing WSI dots as described herein are ideally executed using a combination of software to create the desired digital pattern, and an exposure system programmed to detect isolated pixels and modulate the size of the isolated pixel when creating a mask. The mask is then ideally used for making a plate using a system designed to create flattop pixel structures, as are known in the art. One exemplary imager programmable to boost isolated pixels to create a mask with microcells as described herein is a CDI Digital Imager manufactured by Esko-Graphics Imaging GmbH, of Itzehoe, Germany, with GRAPHOLAS (version 10.3.0 or higher) software installed, and capable of creating flat top dots. In particular, Esko's "Full HD" and CDI Crystal systems, which include Pixel Boost and inline UV capabilities, are ideal for practicing the steps described herein. Boosting isolated pixels provides a level of fine tuning with resolution generally not available using only the features in the screen. Such fine tuning permits tonality to be defined in the screen, and ink transfer capability defined using hardware modulation.

Although described herein in connection with Esko hardware, the invention is not limited to any particular manufacturer's system. Systems for creating flat top dots using UV exposure are known in the art. In an Esko system, for example, such systems may be equipped with a particular UV head and servo capable of turning the drum at a desirable speed, and with high resolution optics, such as a gradient index or aspheric focus lens. The use of flattop exposure is particularly desirable because it keeps the exposure on the top of plate, making for more pronounced "holes" for ink to fill when the plate is created from that mask. In general, use of an UV head that does not imitate bank light and, does not have a broad angular distribution is also possible.

The systems usable to create desirable plate characteristics as described herein are not limited to exemplary systems discussed herein. The term "mask" as used herein may refer to any type of structure used during a plate exposure step. Although shown and described herein with respect to a UV exposure system for creating a plate via exposure through a mask, however, it should be understood that a laser system for ablating plate material directly may also be programmed to modulate laser power in a way that creates the desired effect on the plate. Any method for modulating the opening size on a mask, not limited to laser exposure, may be used. Similarly, any plate making method, using a mask or otherwise, that can translate screen information in such a way that it creates the desired plate structures corresponding to the screen with the ink transfer characteristics resulting therefrom, can be used in conjunction with the screen structures described herein.

Printed matter created using plates created by the systems and methods described herein tend to have a dot gain that is less dependent upon the screen ruling and the dot gain curve has minimized tonal jump. The techniques also minimize dot bridging.

Figure 15A:
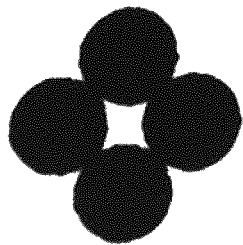
FIG. 15A depicts a cluster of 4 adjacent pixels showing the area exposed by the corresponding to each of the pixels at a level of exposure that does not cause overlapping of the exposure areas.
Figure 15B:
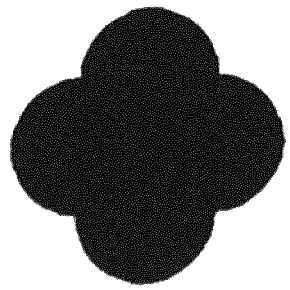
FIG. 15B depicts a cluster of 4 adjacent pixels showing the area exposed by the laser corresponding to each of the pixels using laser power intended to cause each exposure area to overlap sufficiently to produce a solid dot.
Figure 15C:
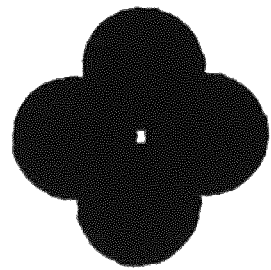
FIG. 15C depicts a cluster of 4 adjacent pixels showing the area exposed by the laser corresponding to each of the pixels at a level of laser exposure between that of FIGS. 15A and 15B, leaving an unexposed area in the center.

Although described herein in connection with a screen having WSI structures as described herein (i.e. a high resolution base pattern of isolated dots), and there are advantage using such a screen in combination with laser boosting, desirable ink transfer characteristics may be created using any system tunable to selectively modulate the size of physical spots on the plate or the mask corresponding to the screening spots such that each set of four neighboring physical spots in the base pattern has an unexposed area centered therebetween. For example, as shown in FIG. 15B, laser exposure of individual pixels is typically selected to provide overlapping spots to fully cover solid areas. Laser modulation may be used, however, to provide a smaller spot size corresponding to each exposed pixel such that an unexposed area arises centered among the four neighboring spots, such as is shown in FIG. 15C. As shown in both FIGS. 15A and 15C, the spots formed by the lasers are not fully overlapping as they are in FIG. 15B. Although depicted with the spots touching in FIG. 15A, it should be noted that a configuration in which the spots are not touching may also be used, such as if the solid ink density is adjusted to less than maximum, but with the same uniformity of the ink film on the substrate. Thus, for example, rather than creating a high resolution screen with isolated pixels, a lower resolution screen may be used in conjunction with laser modulation that ensures that regardless of the screen dot size, the actually imaged structure contains small unexposed areas that provide the ink transfer advantages discussed herein.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for creating a flexographic plate, the process comprising:
   providing an unexposed flexographic plate comprising a masking layer disposed on a surface of the unexposed flexographic plate;
   using an imager to create a mask by forming openings in the masking layer, the openings configured to permit exposure of the unexposed flexographic plate to UV radiation during an exposure step prior to further processing that results in a completed flexographic plate ready for receiving ink, the steps for forming the openings in the masking layer comprising:
   (a) providing image information corresponding to ink-carrying and non-ink-carrying portions of the completed flexographic plate, the ink-carrying portions comprising a plurality of ink-carrying elements;
   (b forming openings in the masking layer in accordance with the image information by:
      (i) superimposing on the image information a base pattern of equally sized spots, each spot corresponding to an imaged or non-imaged discrete element represented on the mask, wherein each spot corresponding to an imaged discrete element in the base pattern is surrounded by eight spots corresponding to non-imaged discrete elements, wherein the spots corresponding to the imaged and non-imaged elements are aligned to a grid defined by an imaging resolution of the imager, each imaged discrete element corresponding to an opening in the mask, and each non-imaged discrete element corresponding to a non-open area of the mask;
      (ii) selecting a size for forming each imaged discrete element such that each set of four neighboring imaged discrete elements has a non-imaged discrete area centered therebetween, wherein the non-imaged discrete area is configured to resolve to a region on a surface of the completed flexographic plate having a level below an uppermost level of the completed flexographic plate but above a non-printing level of the completed flexographic plate and each of the four neighboring imaged discrete elements is configured to resolve to the uppermost level of the completed flexographic plate;
   wherein step (b)(1) comprises defining in the image information a plurality of pixels and the superimposing comprises converting a first pixel in a first screen to a group of four pixels in a second screen, wherein each exposed first screen pixel translates into 1 exposed and 3 non-exposed second screen pixels, and providing the second screen as the image information to the imager.

2. The process of claim 1, wherein each spot in the base pattern has a size corresponding to a size of a smallest discrete element represented on the mask.

3. The process of claim 2, where each imaged discrete element corresponds to spatial resolution of a laser beam used for forming the discrete imaged elements on the mask, the process further comprising ablating the mask with the laser beam.

4. The process of claim 3, wherein the step of ablating the mask with the laser beam comprises boosting power of the laser beam used for ablating each isolated discrete imaged elements relative to power of the laser beam used for ablating non-isolated discrete imaged elements.

5. The process of claim 3 comprising adjusting power of the laser beam for ablating each opening in the mask for optimization of a resulting size of the region on the completed flexographic plate surface below the uppermost level but above the non-printing level for optimizing ink transfer in press.

6. The process of claim 3 comprising adjusting power of the laser beam for ablating each opening in the mask for optimization of a resulting size of the region on the completed flexographic plate surface below the uppermost level but above the non-printing level to promote a peak solid ink density for a predetermined set of operating conditions.

7. The process of claim 3, comprising ablating the mask such that each of the ablated four neighboring imaged discrete elements has a size greater in area than the unablated area centered therebetween.

8. The process of claim 3, comprising ablating the mask such that each of the ablated neighboring imaged discrete elements in the set of four touch or overlap at least two others in the set.

9. The process of claim 3, comprising ablating the mask such that none of the ablated neighboring smallest discrete imaged elements in the set of four touch or overlap another in the set.

10. The process of claim 1, wherein step (b)(i) comprises:
(A) defining in the image information a first screening supercell of a threshold array, the first screening supercell comprising a first plurality of pixels, each pixel having a filled or an empty pixel value;
(B) for each pixel having a filled pixel value located at (X, Y) in the first screening supercell, assigning a location (X', Y') in a second supercell comprising a second plurality of pixels each having a filled or empty pixel value by applying a first mathematical formula:

$$X'=fx(X,Y)$$

$$Y'=fy(X,Y)$$

(C) setting pixel values for the plurality of pixels in the second supercell such that pixels not having a value set by the first mathematical formula are set to an empty pixel value;
wherein the first mathematical formula adheres to a set of rules comprising (i) X' and Y' are integer numbers, (ii) no two pixels of the first supercell are transformed to a same pixel in the second supercell, (iii) all pixels (X',Y') having a filled value define the base pattern of spots in which surrounding each pixel (X',Y') having a filled value are at least 8 empty pixels having an empty value not set by the mathematical formula.

11. The process of claim 10, wherein:

$$fx(X,Y)=2X$$

$$fy(X,Y)=2Y.$$

12. The process of claim 10, wherein:

$$fx(X,Y)=nX+nY$$

$$fy(X,Y)=nX-nY$$

in which n=an integer greater than or equal to 1.

13. The process of claim 12, wherein n=2.

14. The process of claim 10, wherein the first supercell has a lines per inch (Lpi) and an angle (Ang), and applying fx(X,Y) and fy(X,Y) creates in the second supercell a line per inch (Lpi'=f3(Lpi)) and an angle (Ang'=f4(Ang)), the process further comprising applying for a desired Lpi and desired Ang for the second supercell, a reverse transformation formula $$Lpi''=f3^{-1}(\text{desired Lpi})$$

$$Ang''=f4^{-1}(\text{desired Ang})$$

and creating a screen having a lines per inch Lpi" and an angle Ang".

15. The process of claim 14, comprising creating a set comprising a plurality of screens, each screen corresponding to an ink color, the process further comprising:
(D) for a desired lines per inch and angle for the set, calculating Lpi" and Ang" for each screen;
(E) identifying a closely matching ruling/angle set that is free of second order moiré;
(F) generating a plurality of first screening supercells corresponding to the closely matching ruling/angle set;
(G) converting each of the plurality of first screening supercells to corresponding second screening supercells.

16. The process of claim 10, further comprising creating the second supercell having a size and a desired ruling and angle, creating a third supercell having the same size and the same desired ruling and angle as the second supercell, the third supercell corresponding to screen configured to improve highlights, and merging the second and third supercells into a fourth supercell by performing an operation comprising:
(D) for each pixel, determining a cell to which the pixel belongs;
(E) based upon the determined cell, determining from which of the second and third supercells to copy information;
(F) copying the information into the fourth supercell from the second or third supercell as determined in step (D).

17. The process of claim 16, wherein the determination in step (E) is random.

18. The process of claim 17, wherein the random determination is performed using a blue noise determination.

19. The process of claim 16, wherein the determination in step (E) is made systematically.

20. The process of claim 16, comprising copying information from the second supercell at relatively higher tonal densities and copying information from the third supercell at relatively lower tonal densities.

21. The process of claim 16, wherein the third supercell includes a solid AM dot pattern.

22. The process of claim 16, comprising performing steps (D)-(F) for an entirety of the threshold array.

23. The process of claim 16, further comprising the steps of:
creating a third supercell by applying a second mathematical formula:

$$X'=fx(X,Y)$$

$$Y'=fy(X,Y)$$

wherein the second mathematical formula is different than the first mathematical formula but adheres to the same rules, and;
creating a fourth supercell by merging the second and the third supercells, wherein merging the second and third supercells comprises:
(D) for each pixel, determining a cell to which the pixel belongs;
(E) based upon the determined cell, determining from which of the second and third supercells to copy information;
(F) copying the information into the fourth supercell from the second or third supercell as determined in step (D).

24. The process of claim 1, further comprising applying the process to an original screen embodying highlight-improving techniques in at least a portion thereof.

25. The process of claim 1, wherein each second screen pixel represents a highest resolution level of the mask.

26. The process of claim 1, further comprising:
exposing the unexposed plate to UV radiation through the openings in the mask to form an exposed plate;
processing the exposed plate to form the completed flexographic plate having the region on the surface thereof corresponding to the non-imaged area of the mask resolved to the level below the uppermost level but above the non-printing level and each of the four neighboring imaged discrete elements resolved to the uppermost level.

27. The process of claim 26, wherein the exposure step comprises exposing the unexposed flexographic plate to UV radiation configured to produce flat top dots on the completed flexographic plate.

28. A completed flexographic plate comprising a product of the process of claim 26.

* * * * *